(12) United States Patent
Xu et al.

(10) Patent No.: US 8,286,063 B2
(45) Date of Patent: Oct. 9, 2012

(54) DECODING METHOD AND DEVICE FOR REED-SOLOMON CODE

(75) Inventors: Jin Xu, Shenzhen (CN); Jun Xu, Shenzhen (CN); Zhifeng Yuan, Shenzhen (CN); Liujun Hu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 182 days.

(21) Appl. No.: 12/988,643

(22) PCT Filed: Aug. 25, 2008

(86) PCT No.: PCT/CN2008/072132
§ 371 (c)(1),
(2), (4) Date: Oct. 20, 2010

(87) PCT Pub. No.: WO2009/129675
PCT Pub. Date: Oct. 29, 2009

(65) Prior Publication Data
US 2011/0041034 A1    Feb. 17, 2011

(30) Foreign Application Priority Data
Apr. 23, 2008  (CN) .......................... 2008 1 0093233

(51) Int. Cl.
*H03M 13/00* (2006.01)

(52) U.S. Cl. ................... 714/784; 714/755; 714/799

(58) Field of Classification Search .............. 714/752, 714/784, 755
See application file for complete search history.

(56) References Cited

U.S. PATENT DOCUMENTS

| 6,212,659 | B1 |   | 4/2001  | Zehavi         |         |
|-----------|----|---|---------|----------------|---------|
| 6,553,538 | B2 |   | 4/2003  | Zehavi         |         |
| 6,889,356 | B1 | * | 5/2005  | Alamouti       | 714/792 |
| 6,895,547 | B2 | * | 5/2005  | Eleftheriou et al. | 714/801 |
| 7,000,168 | B2 | * | 2/2006  | Kurtas et al.  | 714/755 |
| 7,617,439 | B2 | * | 11/2009 | Shen et al.    | 714/784 |
| 7,617,441 | B2 | * | 11/2009 | Lee et al.     | 714/800 |

(Continued)

FOREIGN PATENT DOCUMENTS

CN    1262004 A    8/2000

(Continued)

OTHER PUBLICATIONS

Supplementary European Search Report in European application No. 08784122.7, mailed on Apr. 8, 2011.

(Continued)

*Primary Examiner* — Esaw Abraham
(74) *Attorney, Agent, or Firm* — Oppedahl Patent Law Firm LLC

(57) ABSTRACT

The present invention provides a decoding method and device for Reed-Solomon (RS) codes. The method includes the following steps: A: filling data to be decoded in a byte interleaver by column in turn; B: performing cyclic shift to data in a check region of the byte interleaver by row and/or by column, so as to make the data of each row in the check region become check data in sequence of data of corresponding row in an information region of the byte interleaver; C: performing RS decoding by row method, and writing information data of each row obtained after decoding into the corresponding row in the information region of the byte interleaver in turn; and D: reading business data of the decoded information data from the information region of the byte interleaver by column. The method and device of the present invention achieve the best interleaving effect.

10 Claims, 7 Drawing Sheets

U.S. PATENT DOCUMENTS

| | | | |
|---|---|---|---|
| 7,617,442 B2 * | 11/2009 | Shen et al. ............. | 714/801 |
| 7,954,036 B2 * | 5/2011 | Eroz et al. ............. | 714/758 |
| 2001/0004761 A1 | 6/2001 | Zehavi | |
| 2004/0073861 A1 | 4/2004 | Lauer | |
| 2005/0078764 A1 | 4/2005 | Gresset et al. | |
| 2006/0026492 A1 | 2/2006 | Rhee | |
| 2006/0085726 A1 | 4/2006 | Rhee | |

FOREIGN PATENT DOCUMENTS

| | | |
|---|---|---|
| CN | 1490946 A | 4/2004 |
| EP | 1285504 A2 | 2/2003 |
| EP | 1511212 A1 | 3/2005 |
| RU | 2310273 C2 | 11/2007 |
| WO | 9854866 A2 | 12/1998 |
| WO | 0189135 A2 | 11/2001 |

OTHER PUBLICATIONS

International Search Report on international application No. PCT/CN2008/072132, mailed on Feb. 5, 2009.

English Translation of the Written Opinion of the International Search Authority in international application No. PCT/CN2008/072132, mailed on Feb. 5, 2009.

* cited by examiner

DECODING METHOD AND DEVICE FOR REED-SOLOMON CODE

TECHNICAL FIELD

The present invention relates to the field of communications, particularly to a decoding method for Reed-Solomon (RS in short) codes.

BACKGROUND

A linear grouping code is a group of code blocks with fixed length, which can be presented as (n,k), and usually used for forward error correction. During coding, k information bits are grouped into length of n-bit code block. As $2^k$ code words in [n,k,d] grouping code make up a k-dimension sub-space, the $2^k$ code words can consist of k linearly independent bases, and if the k bases are written into form of matrix, then:

$$G = \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix}.$$

Any code word in [n,k,d] code can be generated from linear combination of this group of bases, i.e.:

$$C = m \cdot G = \begin{bmatrix} m_1 & m_2 & \cdots & m_{n-k} \end{bmatrix} \cdot \begin{bmatrix} g_{1,n-1} & g_{1,n-2} & \cdots & g_{1,0} \\ g_{2,n-1} & g_{2,n-2} & \cdots & g_{2,0} \\ \vdots & \vdots & & \vdots \\ g_{k,n-1} & g_{k,n-2} & \cdots & g_{k,0} \end{bmatrix}.$$

G is a code generation matrix. Obviously, for each row in the generation matrix, it is enough as long as linear independence can be fulfilled (without consideration of minimum distance), while the base of a k-dimension space can select k linearly independent vectors at random, so that the G as the code generation matrix is not unique. However whichever form is taken, they generate the same sub-space, namely the same [n,k,d] code.

An RS code is a linear grouping cyclic code, which is processed in unit (usually n=8 bytes, named as coding word) of a group of symbols of length n, and the n symbols in the group are generated from k information symbols to be transmitted based on certain association relationship. As the n symbols should also include error protection information, therefore the coding form is required to be expressed with (n,k), wherein k<n; so if n=8, then there are $2^8$=256 kinds of symbols in total, and the symbols expressed in decimal system are in range of 0 to 255. The 256 kinds of symbols make up a finite field (named as Galois field) $GF(2^8)$. Generally, if the finite field is extension field of binary field GF(2), it is expressed as $GF(2^m)$. In the field of $GF(2^m)$, t wrong (n, k) RS codes can be corrected, the number of check symbols is 2×t, and the minimum code distance $d_{min}$=2×t+1=n−k+1 (check matrix is a non-singular matrix). So-called 1 symbol error can be 1 bit wrong in the symbol, or several bits and even all m bits in the symbol can be wrong. It can be seen that, the RS code has extremely powerful random error and burst error correction ability, so it is very widely used in the field of digit error control.

A link layer provides data transmission service for a network layer, and this service is realized based on functions of this layer. The link layer has the following functions: establishment and removal of data link, frame transmission and frame synchronization, error and flow control, and data link management. As supplementation to forward error correction technique in physical link layer, the forward error correction (FEC) in link layer is used for realizing functions of error control in link layer, so that the preceding layer of protocol can receive data packet without error. The RS code is very suitable as a link layer forward error correction code due to its excellent performances.

Common interleavers in digital communications can be classified into byte interleaver and bit interleaver based on interleaving objects. The main function of byte interleaver is to disorganize the sequence of original bytes, so that the locations of error seem to be random, and the dependence between byte sequences before and after interleaving is weakened, and distributed among many code words instead of a few code words. An outstanding advantage of such practice is that the influence of data burst error is significantly lowered.

To further improve the performances of link layer FEC, the RS coder and decoder may be usually used together with the byte interleaver. Normally, the byte interleaver can use row-and-column interleaver, of which column number is equal to RS code length, and row number changes with code block number. For example, the byte interleaver in RS(255,207) code is fixed as 255 columns, wherein the 207 columns on the left side are information region, and the 48 columns on the right side are check region. The row number and column number in the interleaver can be started, but not limited to, numbering from 0. The consistency for description in the present invention starts numbering from 0 without exception.

Among the RS code interleaving coding methods in existing technologies, when a business data packet is input into the byte interleaver, firstly fill the $0^{th}$ column from top to bottom, and after completion of filling the $0^{th}$ column, fill the $1^{st}$ column from top to bottom, and so on, until all the data in the business data packet are filled into the interleaver, the unfilled portion in the previous 207 columns is filled in with 0. The check values in each row are formed according to data information in the previous 207 bits. The form after interleaving coding is as shown in FIG. 1, wherein K=207, S=48. When outputting the data in the interleaver, the output starts from the $0^{th}$ column from top to bottom in turn, and after completion of output the $0^{th}$ column, output data from the $1^{st}$ column by sequence from top to bottom, until all the data of the 255 columns output completely.

The RS code interleaving coding and the corresponding decoding method in the existing technologies have the following drawbacks: the portions with filling value of 0 in the information region are pooled together; as the data are transmitted by column, this will result in relatively overmuch protection in continuous time region corresponding to the row with more filling value in the column, while the continuous time region with fewer filling values in the column has relatively less protection; in addition, though the data in the check region are generated by row and read out by column, the data interleaving during output is over-regular, and fails to reach the optimum interleaving effect, so that the performances of the whole output data packet fails to be optimum.

SUMMARY

The technical problem to be solved by the present invention is to provide a method and device for RS codes so as to achieve the best interleaving effect.

To solve the above-mentioned problem, the present invention provides a decoding method for Reed-Solomon (RS) codes. The method includes the following steps:

A: filling data to be decoded in a byte interleaver by column in turn;

B: performing cyclic shift to data in a check region of the byte interleaver by row and/or by column, so as to make the data of each row in the check region become check data in sequence of data of corresponding row in an information region of the byte interleaver;

C: performing RS decoding by row method, and writing information data of each row obtained after decoding into the corresponding row in the information region of the byte interleaver in turn; and D: reading business data of the decoded information data from the information region of the byte interleaver by column.

Further, in step B, the cyclic shift may be performed to the data in the check region of the byte interleaver by column, and a bit number of shifting all rows in the $i^{th}$ column in the check region may be: floor(i×M/S); wherein, M is a row number of the byte interleaver, and S is a column number of the check region, i is 0, 1, . . . , S−1.

Further, step D may include the following sub-steps:

D1: the business data from the $0^{th}$ to $(kc-1)^{th}$ column in the information region of the byte interleaver are read in turn; and D2: if the $(kc)^{th}$ column includes business data of d bytes, and $0<d \leq M/2$, then the remaining d bytes of the business data are read from the $0^{th}$, $g^{th}$, $(2 \times g)^{th}$, . . . , $((d-1) \times g)^{th}$ row of the column from top to bottom in turn;

if the $(kc)^{th}$ column includes business data of d bytes, and $d>M/2$, then the remaining d bytes of the business data are read from rows except the $0^{th}$, $h^{th}$, $(2 \times h)^{th}$, . . . , $((M-d-1) \times h)^{th}$ row of the column from top to bottom in turn;

wherein, the byte number of valid data is F, and the row number of the byte interleaver is M, kc=floor(F/M), d=FmodM, g=floor(M/d), h=floor(M/(M−d)).

Further, in step B, for the data in the check region of the byte interleaver, the cyclic shift may be performed from bottom to top.

To solve the above-mentioned technical problem, the present invention also provides a decoding device for Reed-Solomon codes. The device includes: a data filling unit, a byte interleaver and a decoding unit; the device also includes a cyclic shift unit and a data extraction unit; wherein:

the data filling unit is used for filling the byte interleaver with data to be decoded by column in turn;

the cyclic shift unit is used for sending cyclic shift control signals to the byte interleaver, and performing cyclic shift to data in a check region of the byte interleaver by row and/or by column, so as to make the data of each row in the check region become check data in sequence of data of corresponding row in an information region of the byte interleaver;

the decoding unit is used for performing RS decoding to data in the byte interleaver by row method, and writing information data of each row obtained after decoding into the corresponding row in the information region of the byte interleaver in turn; and the data extraction unit is used for reading business data of the decoded information data from the information region of the byte interleaver by column.

Further, the cyclic shift may be performed to the data in the check region of the byte interleaver by column by the cyclic shift unit, a bit number of shifting all rows in the $i^{th}$ column in the check region may be: floor(i×M/S); wherein, M is a row number of the byte interleaver, and S is a column number of the check region, I is 0, 1, . . . , S−1.

Further, the data extraction unit may be used for reading the business data from the $0^{th}$ to $(kc-1)^{th}$ column in the information region of the byte interleaver in turn; and if the $(kc)^{th}$ column includes business data of d bytes, and $0<d \leq M/2$, then the data extraction unit reads the remaining d bytes of the business data from the $0^{th}$, $g^{th}$, $(2 \times g)^{th}$, . . . , $((d-1) \times g)^{th}$ row of the column from top to bottom in turn;

if the $(kc)^{th}$ column includes business data of d bytes, and $d>M/2$, then the data extraction unit reads the remaining d bytes of the business data from rows except the $0^{th}$, $h^{th}$, $(2 \times h)^{th}$, . . . , $((M-d-1) \times h)^{th}$ row of the column from top to bottom in turn;

wherein the byte number of valid data is F, and the row number of the byte interleaver is M, kc=floor(F/M), d=FmodM, g=floor(M/d), h=floor(M/(M−d)).

Further, for the data in the check region of the byte interleaver, the cyclic shift may be performed from bottom to top by the cyclic shift unit.

Another technical problem to be solved by the present invention is to provide a decoding method and device for Reed-Solomon codes ao as to improve the interleaving time diversity effect.

The present invention also provides a decoding method for Reed-Solomon codes, which includes the following steps:

a: filling data to be decoded in a byte interleaver by column in turn;

b: performing RS decoding by row method, and writing information data of each row obtained after decoding into the corresponding row in an information region of the byte interleaver in turn;

c: reading business data from the $0^{th}$ to $(kc-1)^{th}$ column in the information region of the byte interleaver in turn;

d: if the $(kc)^{th}$ column includes business data of d bytes, and $0<d \leq M/2$, then the remaining d bytes of the business data are read from the $0^{th}$, $g^{th}$, $(2 \times g)^{th}$, . . . , $((d-1) \times g)^{th}$ row of the column from top to bottom in turn;

if the $(kc)^{th}$ column includes business data of d bytes, and $d>M/2$, then the remaining d bytes of the business data are read from rows except the $0^{th}$, $h^{th}$, $(2 \times h)^{th}$, . . . , $((M-d-1) \times h)^{th}$ row of the column from top to bottom in turn;

wherein the byte number of valid data is F, and the row number of the byte interleaver is M, kc=floor(F/M), d=FmodM, g=floor(M/d), h=floor(M/(M−d)).

The present invention also provides a decoding device for Reed-Solomon codes, which includes: a data filling unit, a byte interleaver and a decoding unit; the device also includes a data extraction unit; wherein:

the data filling unit is used for filling the byte interleaver with data to be decoded by column in turn;

the decoding unit is used for performing RS decoding to data in the byte interleaver by row method, and writing information data of each row obtained after decoding into the corresponding row in an information region of the byte interleaver in turn;

the data extraction unit is used for reading business data from the $0^{th}$ to $(kc-1)^{th}$ column in the information region of the byte interleaver in turn; and if the $(kc)^{th}$ column includes business data of d bytes, and $0<d \leq M/2$, then the data extraction unit reads the remaining d bytes of the business data from the $0^{th}$, $g^{th}$, $(2 \times g)^{th}$, . . . , $((d-1) \times g)^{th}$ row of the column from top to bottom in turn;

if the $(kc)^{th}$ column includes business data of d bytes, and $d>M/2$, then the data extraction unit reads the remaining d bytes of the business data from rows except the $0^{th}$, $h^{th}$, $(2 \times h)^{th}$, . . . , $((M-d-1) \times h)^{th}$ row of the column from top to bottom in turn;

wherein the byte number of valid data is F, and the row number of the byte interleaver is M, kc=floor(F/M), d=FmodM, g=floor(M/d), h=floor(M/(M−d)).

The RS code decoding method and device in the present invention are used with corresponding RS code interleaving coding method. If cyclic shift is used in direction of row, the influence of continuous errors in the data packet on decoding can be avoided; if cyclic shift is used in direction of column, excellent diversity can be guaranteed in row direction, which can play the role of row replacement of row and column interleaver, and can avoid interference of cyclic noise during transmission of the data packet, so as to make the encoding has the best performances; in addition, the interleaving time diversity effect can be better through placing and filling bytes of 0 equably.

DETAILED DESCRIPTION

The present invention provides an RS code interleaving coding method and corresponding RS decoding methods, by scattering regions with filled value of 0 in the final column that contain valid data in an information region, and/or shifting check data in a check region to improve an RS code interleaving coding method in existing technologies, and can reach technical effects which improve the reliability of a data link layer.

Figure 1:
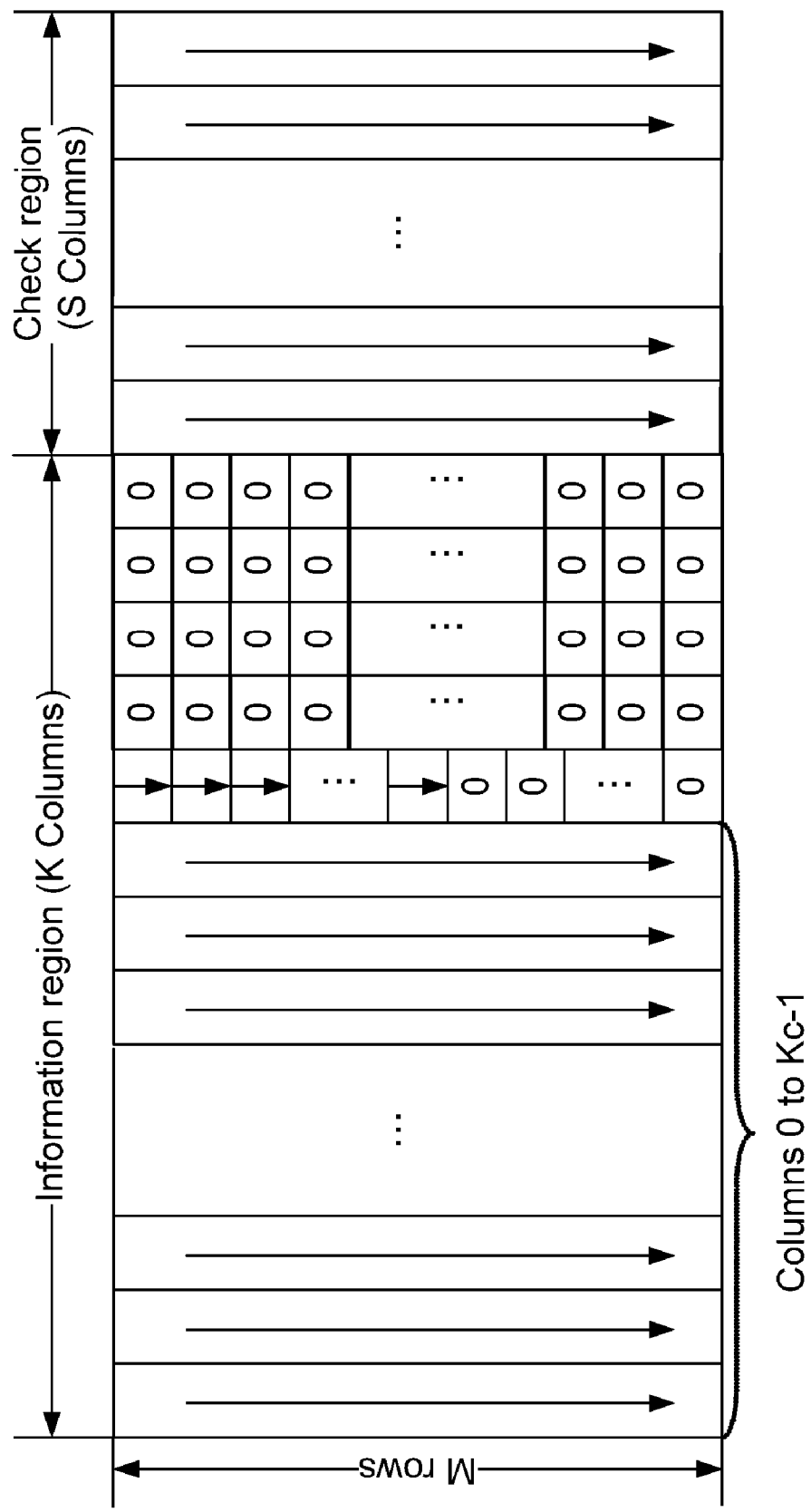
FIG. 1 is a diagram that after RS code interleaving decoding in existing technologies.
Figure 2:
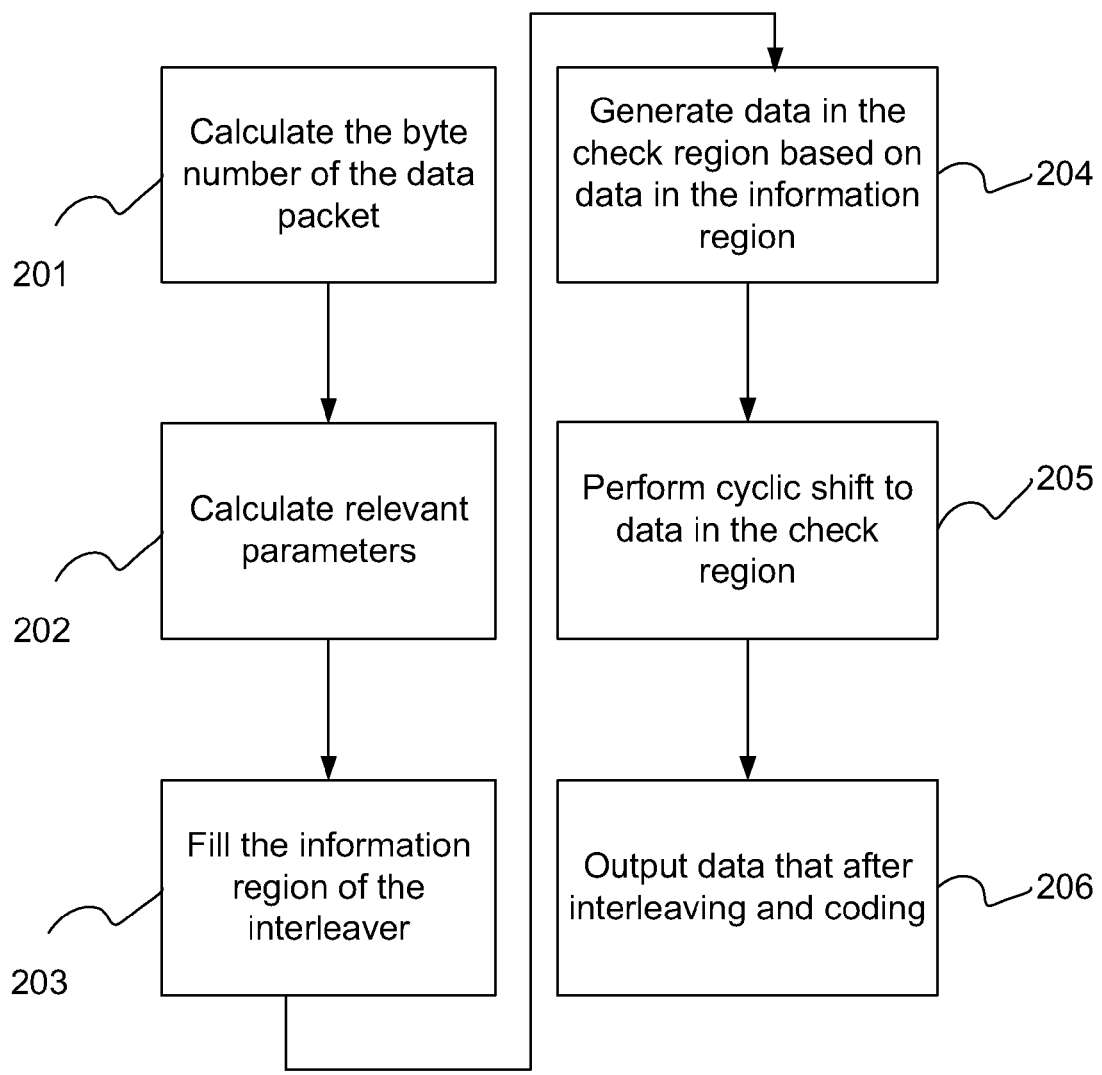
FIG. 2 is a flowchart illustrating an RS code interleaving coding method.

The RS code interleaving coding method and corresponding RS code decoding method and device of the present invention will be described in detail hereinafter with reference to the drawings and embodiments, RS Code Interleaving Coding Method This embodiment provides an RS code interleaving coding method, assume that the given RS code is (N, K, S), then the column number of corresponding byte interleaver is N, and K columns on the left side is an information region, and S (S=N−K) columns on the right side is a check region, the unit of the N, K or S is byte. The row number and column number for the interleaver in this embodiment start numbering from 0, and other numbering methods can also be used in specific realization. As shown in FIG. 2, the specific operations of the method in the present invention are described as follows.

Step 201: internet protocol (IP) data are encapsulated into time-slicing (TS) code stream according to multiple protocols, a byte size of a business data packet is obtained, the byte size of the data packet is set as F bytes, and the specific operation methods of the step are the same as those in existing technologies.

Step 202: according to byte number F of the business data packet and column number k in the information region, row number M of the interleaver and the column number kc that can be filled with valid data in the information region are calculated, and the column filled with valid data refers to the column that can be filled directly with the data in original data packet;

wherein, the row number of the interleaver is M=ceil(F/K), ceil(•) refers to rounding up;

kc=floor(F/M), floor(•) refers to rounding down;

in addition, the following parameters need to be calculated:

d=FmodM, mod means modulus operation; d means byte number for valid data that left after filling the preceding kc columns; and in addition, g=floor(M/d); h=floor(M/(M−d)).

Step 203: according to the parameters obtained from the above-mentioned calculation, the preceding K columns of an RS (N, K, S) code byte interleaver are filled with the business data, namely information region;

this step can be divided into the following sub-steps.

Step 2031: the preceding kc×M bytes of the business data packet are written into preceding kc columns (i.e. from the $0^{th}$ to $(kc-1)^{th}$ column) in the information region by column in turn and by starting from the $0^{th}$ column, and each column is written into in turn from top to bottom;

namely the $0^{th}$ column of the RS(N, K, S) code byte interleaver is started filling in turn from top to bottom, and the $1^{st}$ column is filled in turn from top to bottom after the $0^{th}$ column has filled, and so on, until the preceding kc columns of the RS(N, K, S) code byte interleaver are filled, and each column is filled with M bytes; after filling preceding kc×M bytes, if d is not equal to 0, then step 2032 is executed, otherwise step 204 is executed.

Figure 3:
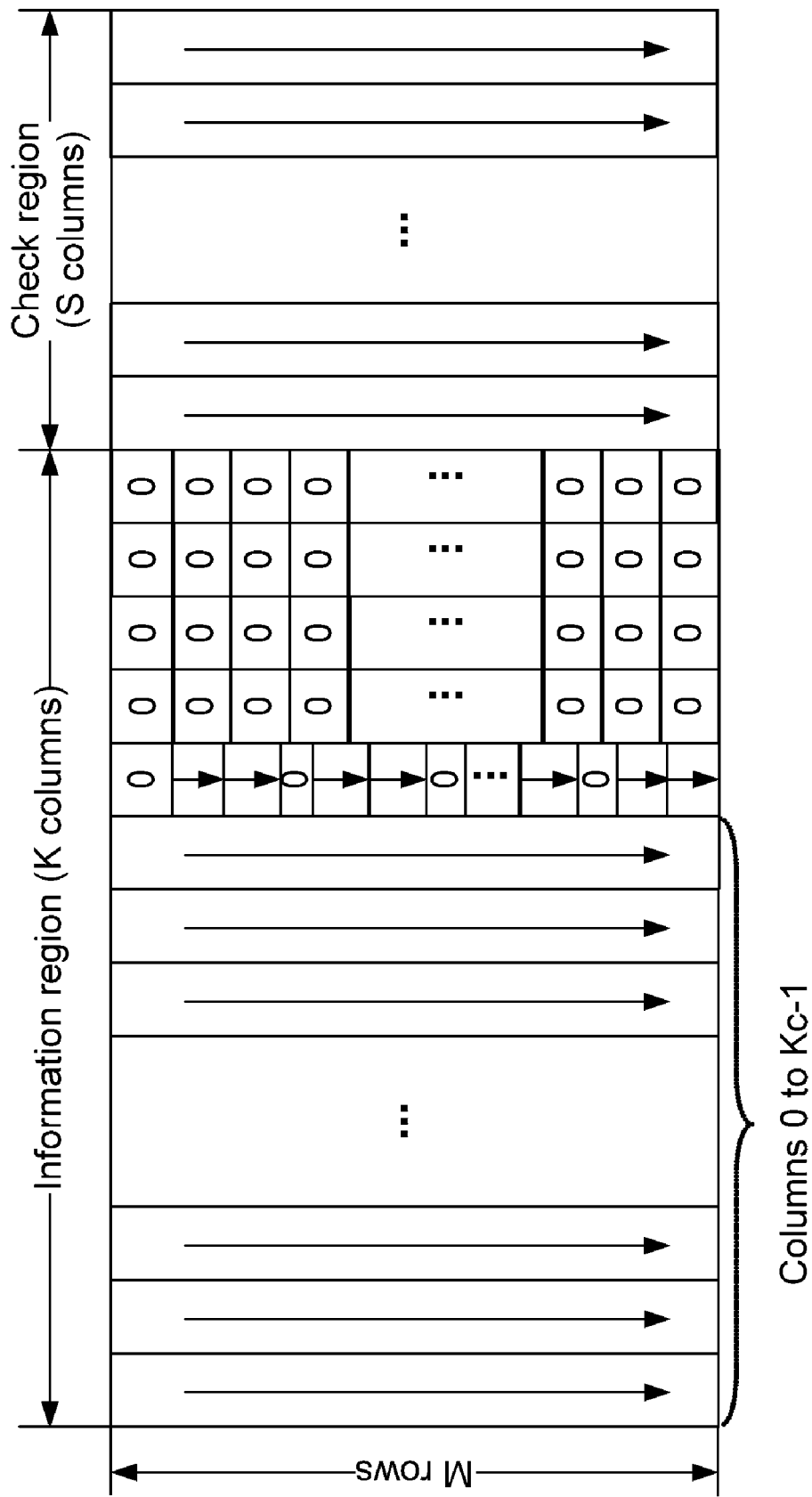
FIG. 3 is a diagram of interleaving filling-portion with an RS code interleaving coding method.

Step 2032: the $(kc)^{th}$ column is filled with the remaining d byte data of the business data packet and M−d bytes of 0;

the specific filling method can be but not limited to:

if d≦M/2, the remaining d bytes of the business data packet are written into the $0^{th}$, $g^{th}$, $(2×g)^{th}$, ..., $((d-1)×g)^{th}$ row in the column from top to bottom in turn, and the remaining positions are filled with M−d bytes of 0;

otherwise, the $0^{th}$, $h^{th}$, $(2×h)^{th}$, ..., $((M-d-1)×h)^{th}$ row in the column are filled with M−d bytes of 0, and the remaining d bytes of the business data packet are written into the remaining row positions from top to bottom in turn, and the filled form is shown in FIG. 3. At such time, in the column, the information data and filling data are almost in state of uniform distribution.

Step 2033: in the remaining part of the information region, i.e. the $(kc+1)^{th}$ to $(K-1)^{th}$ column are totally filled with bytes of 0.

Figure 4:
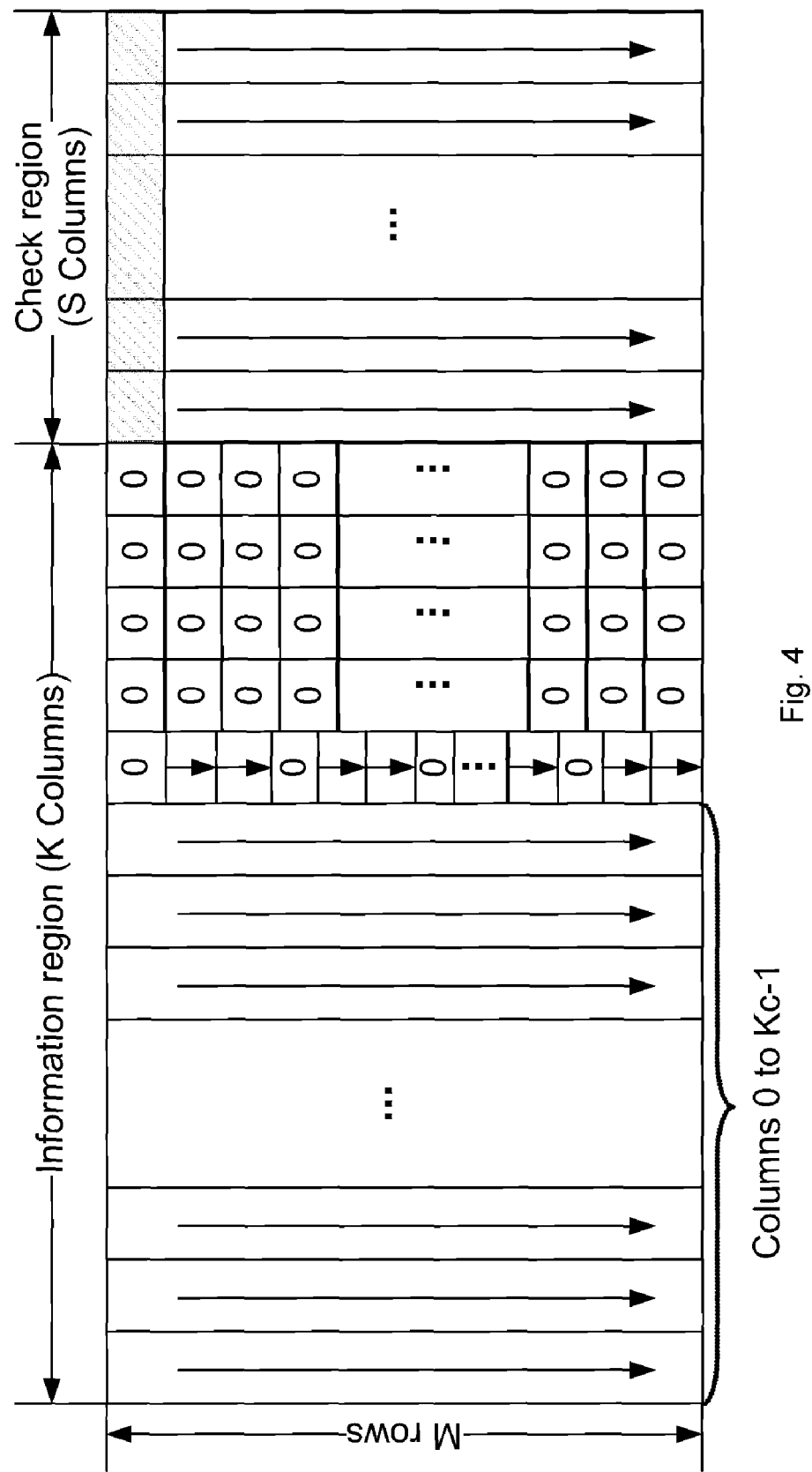
FIG. 4 is a diagram of filling in check data with an RS code interleaving coding method.

Step 204: data of each row in the check region are constructed according to data in the information region, namely RS coding is performed according to row method, and check data of S bytes are added behind each row, and the check data of each row are generated according to the data information of preceding K columns in the row, specific methods are the same as those in existing technologies, the filled form is shown in FIG. 4, which only shows the circumstances for filling the $0^{th}$ row with check data.

Step 205: the check data are performed cyclic shift processing, which can be cyclic shift by row or by column, or cyclic shift by row and by column. The shift bit number in each row or each column may be different, and the shift bit number in each row or each column can be obtained according to certain predefined agreement, such as obtained from calculation based on certain predefined formula;

the cyclic shift by column can use but not limited to the following methods:

for the data of all rows in the $0^{th}$ column, the cyclic shift by column is not done;

for the data of all rows in the $i^{th}$ column, the cyclic shift is done from top to bottom (or from bottom to top), and the shift bit numbers are the same for all data in the same column. The formula for calculating shift bit number can be but not limited to:

floor(i×M/S) bit, i=1, . . . , S−1.

Step 206: the data in the check region in the RS (N, K, S) code byte interleaver are read by column in turn. Each column is read from top to bottom, and the read data are performed extensible protocol encapsulation-forward error correction (XPE-FEC) multiplex adaptation encapsulation.

In summary, using the above-mentioned RS code interleaving coding method, if the cyclic shift is used in direction of row, the influence of continuous error in the data packet on decoding can be avoided; if the cyclic shift is used in direction of column, excellent diversity can be guaranteed in row direction, which can play the role of row replacement of row and column interleaver, and can avoid interference of cyclic noise during transmission of the data packet, so as to make the encoding has the best performances; in addition, the above-mentioned methods also propose that bytes of 0 are placed and filled equably in columns with filled bytes and information data packet bytes, so as to have more uniform protection in term of time. The benefit of such practice is to make better effect on time diversity of interleaving.

RS Code Decoding Method

Figure 5:
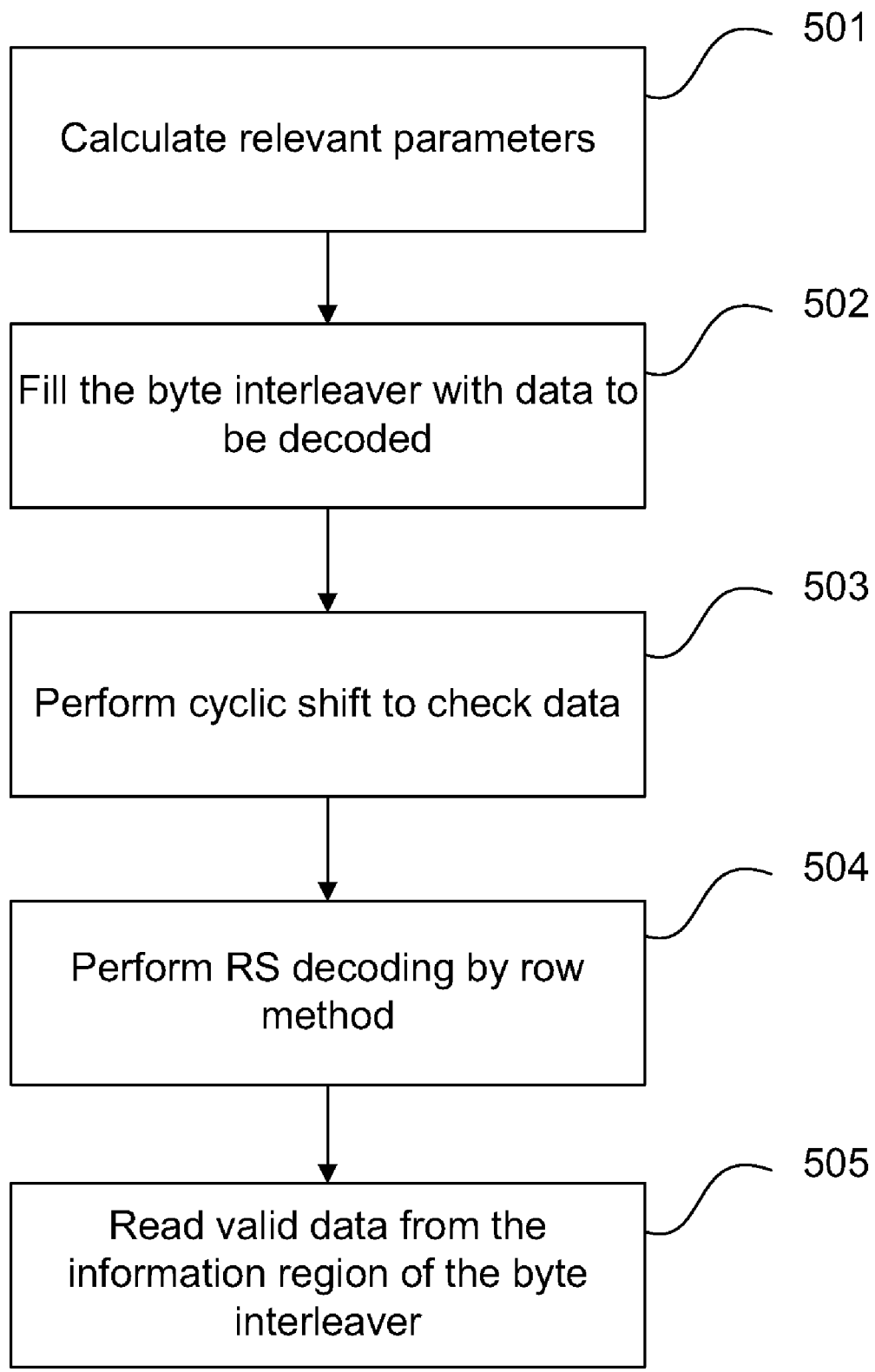
FIG. 5 is a flowchart illustrating an RS code decoding method according to an embodiment of the present invention.

FIG. 5 is a flowchart illustrating an RS code decoding method according to an embodiment of the present invention. The decoding method is a reverse procession corresponding to the above-mentioned coding method. In this embodiment, the RS code is also set as (N, K, S). In addition, the byte number of the data to be decoded (including business data, filling data and corresponding check data) that obtained after decapsulating received business data packet according to multiple protocols is set as T.

As shown in FIG. 5, the method contains the following steps.

Step 501: a row number of a byte interleaver M=ceil (T/N) is calculated according to a byte number of data to be decoded T and column number of the byte interleaver N.

Step 502: an RS (N, K, S) code byte interleaver is filled with the data to be decoded.

Figure 6:
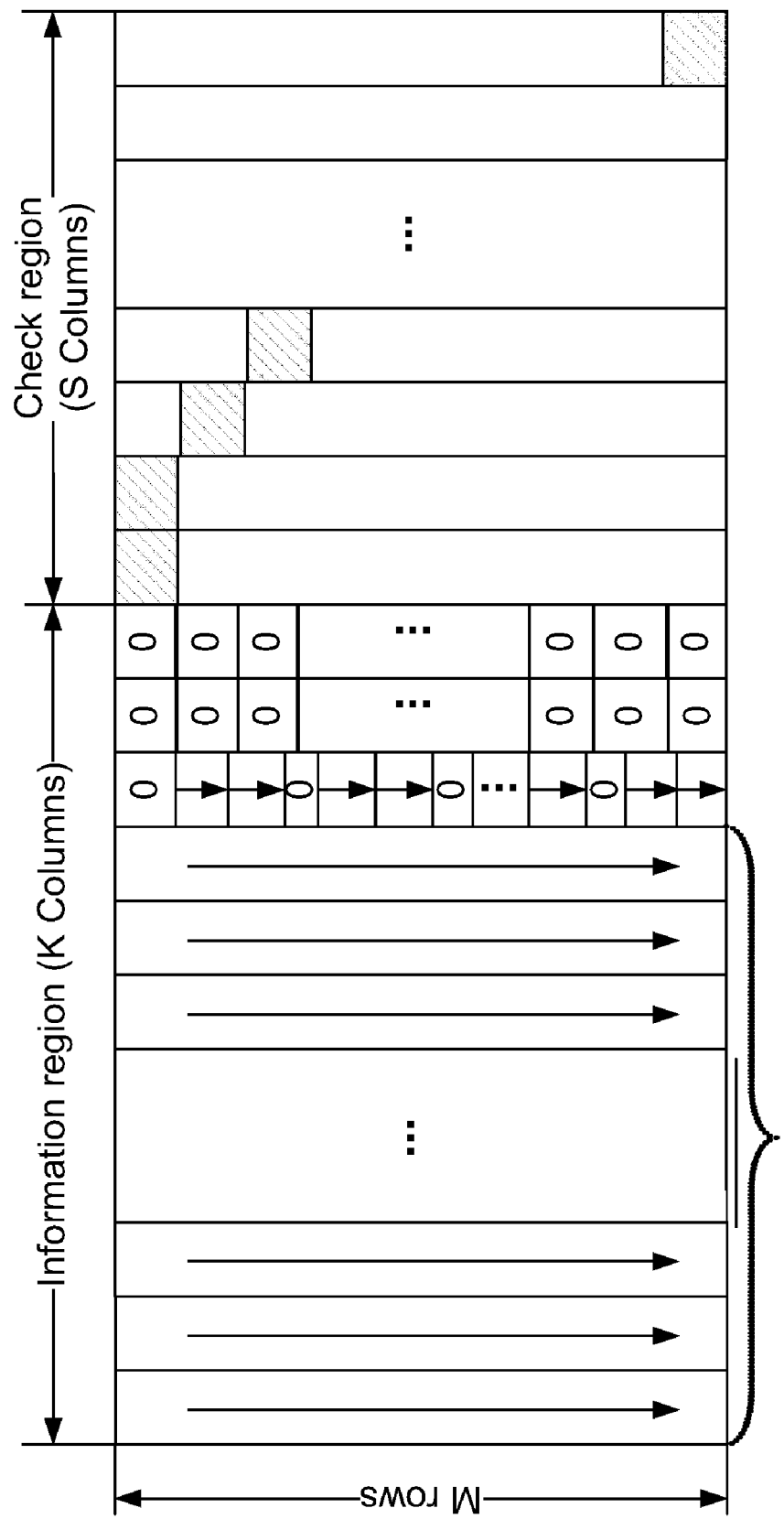
FIG. 6 is a diagram of filling RS (N, K, S) code byte interleaver with data to be decoded according to an embodiment of the present invention.

FIG. 6 is a diagram of filling the RS (N, K, S) code byte interleaver with data to be decoded according to an embodiment of the present invention.

Step 503: check data (namely the data of S columns on the right side in the interleaver as shown in FIG. 6) are performed cyclic shift processing; and cyclic shift rules correspond to those in the corresponding RS interleaving coding process. The cyclic shift processing rule in this step may be either cyclic shift by row, or cyclic shift by column. The shift bit number in each row or each column may be different, and the shift bit number in each row or each column may be obtained according to certain predefined agreement, namely obtained from calculation based on certain predefined formula.

The specific shift method can use but not limited to the following methods: (corresponding to the cyclic shift method in step 205)

for the data of all rows in the $0^{th}$ column, the cyclic shift by column is not done;

for the data of all rows in the $i^{th}$ column, the cyclic shift is done from bottom to top (or from top to bottom), and the shift bit numbers are the same for all data in the same column. The formula for calculating shift bit number can be but not limited to:

floor (i×M/S) bit, i=1, . . . , S−1.

Step 504: RS decoding is performed based on row method according to data in each row of the byte interleaver, information data of K bytes are obtained, which is written in the preceding K columns of the row, so as to obtain the data of each row in the information region. The specific decoding method is the same as that in existing technologies.

Step 505: the valid data in the information region in the RS code byte interleaver which had been decoded are read by column in turn;

this step of operation can be divided into the following sub-steps.

Step 5051: according to byte number F of the valid data sequence (i.e. business data sequence), column number kc that can be filled with valid data in the information region may be calculated, kc=floor (F/M);

the byte number F of the above-mentioned valid data sequence is pre-informed to a receiving end (RS decoding end) via other signaling by a sending end (RS coding end).

Step 5052: the preceding kc columns in the information region are read in turn, each column is read in turn from top to bottom; and the preceding kc×M bytes of the information sequence are obtained.

Step 5053: it is supposed that the remaining d bytes in the information sequence are not read, and if d=0, then end; if d is not equal to 0, then step 5054 is executed;

wherein, d=FmodM.

Step 5054: g=floor(M/d), h=floor(M/(M−d)); the remaining d bytes in the information sequence are read from the $(kc)^{th}$ column in the interleaver via the following methods:

if 0<d≦M/2, then the remaining d bytes in the information sequence are read from the $0^{th}$, $g^{th}$, $(2 \times g)^{th}$, . . . , $((d-1) \times g)^{th}$ row of the column from top to bottom in turn; and if d>M/2, then the positions of the $0^{th}$, $h^{th}$, $(2 \times h)^{th}$, . . . , $((M-d-1) \times h)^{th}$ row of the column are skipped without reading, and the remaining d bytes in the information sequence of remaining rows in the column are read from top to bottom in turn.

It should be noted that step 503 is an optional step, i.e. step 501 to step 502 plus step 504 to step 505 can constitute a complete embodiment.

RS Code Decoding Device

Figure 7:
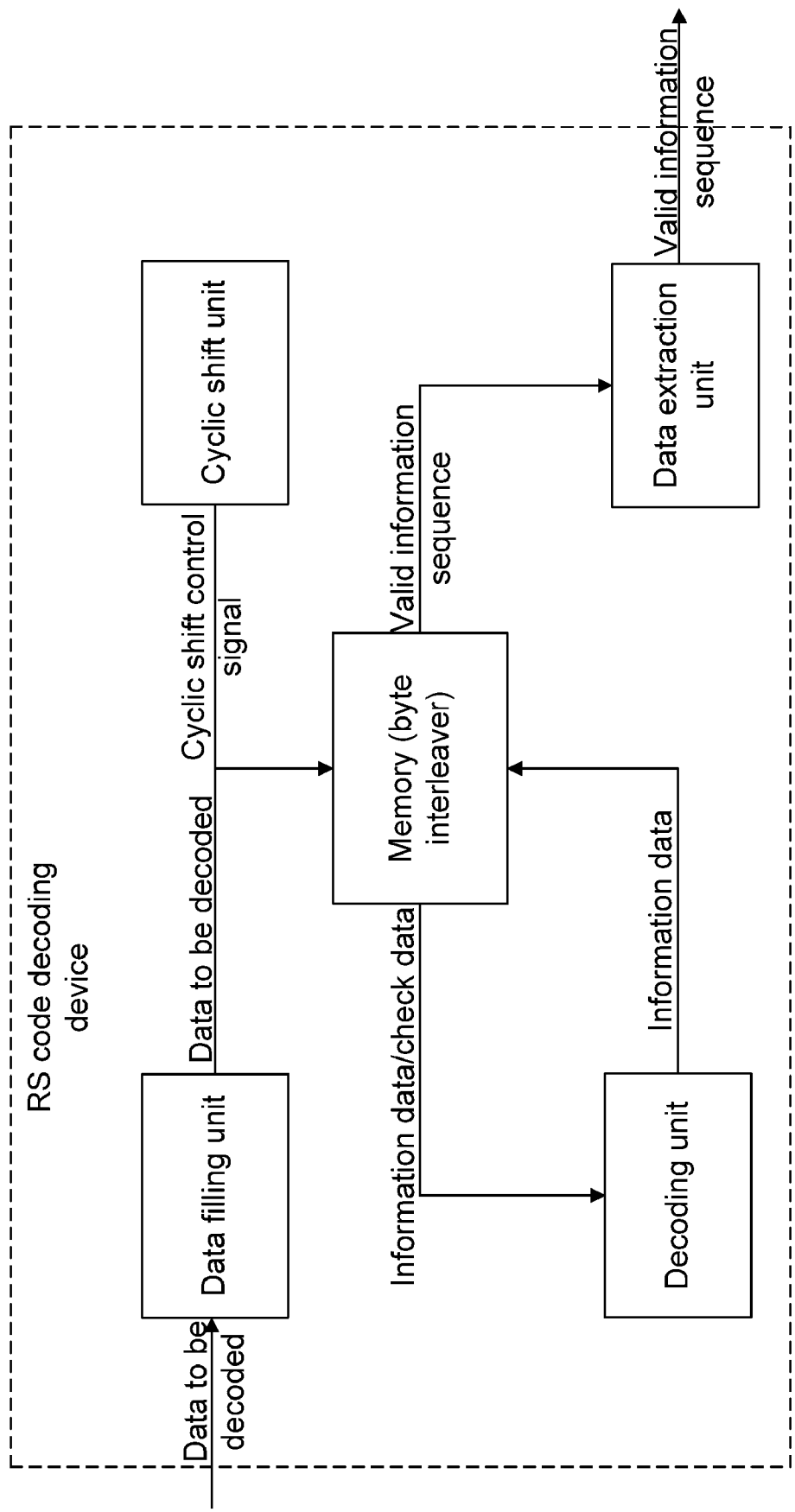
FIG. 7 is a structure diagram illustrating an RS code decoding device according to an embodiment of the present invention.

FIG. 7 is a structure diagram illustrating an RS code decoding device according to an embodiment of the present invention. As shown in FIG. 7, the device includes: a data filling unit, a memory (i.e. a byte interleaver), a cyclic shift unit, a decoding unit, and a data extraction unit, wherein:

the data filling unit is used for receiving data to be decoded, calculating row number of the byte interleaver M based on byte number of data to be decoded T and column number N of the byte interleaver, and filling an RS(N, K, S) code byte interleaver with the data to be decoded; the calculation formula for M is as stated above; and the cyclic shift unit is used for outputting cyclic shift control signals to the byte interleaver, and performing cyclic shift processing to check data in the byte interleaver by row or by column; specific shift methods and calculation formula for shift bit number are as stated above;

it should be noted that the cyclic shift unit is an optional unit;

the decoding unit is used for performing RS decoding to data of each row in the byte interleaver by row method, and obtaining information data of K bytes, which is written in the preceding K columns of the row, so as to obtain the data of each row in information region; and the data extraction unit is used for reading valid data in the information region in the byte interleaver which had been decoded by column in turn, and outputting the valid data sequence; specific reading methods are as stated above.

INDUSTRIAL APPLICABILITY the RS code decoding method and device in the present invention are used with corresponding the RS code interleaving coding method. If cyclic shift is used in direction of row, the influence of continuous errors in the data packet on decoding can be avoided; if the cyclic shift is used in direction of column, excellent diversity can be guaranteed in row direction, which can play the role of row replacement of row and column interleaver, and can avoid interference of cyclic noise during transmission of the data packet, so as to make the encoding has the best performances; in addition, the interleaving time diversity effect can be better through placing and filling bytes of 0 equally.

What is claimed is:

1. A decoding method for decoding Reed-Solomon (RS) codes, including:
   A: filling data in a byte interleaver by column in turn;
   B: performing cyclic shift to data in a check region of the byte interleaver by row and/or by column, making the data of each row in the check region become check data in sequence of data of corresponding row in an information region of the byte interleaver;
   C: performing RS decoding by row method, and writing information data of each row obtained after decoding into the corresponding row in the information region of the byte interleaver in turn; and
   D: reading business data of the decoded information data from the information region of the byte interleaver by column.

2. The method according to claim 1, wherein in step B, the cyclic shift is performed to the data in the check region of the byte interleaver by column, and a bit number of shifting all rows in the $i^{th}$ column in the check region is: floor(i×M/S); wherein, M is a row number of the byte interleaver, and S is a column number of the check region, i is 0, 1, . . . , S−1.

3. The method according to claim 1, wherein step D includes the following sub-steps:
   D1: the business data from the $0^{th}$ to $(kc-1)^{th}$ column in the information region of the byte interleaver are read in turn; and
   D2: if the $(kc)^{th}$ column includes business data of d bytes, and 0<d≦M/2, then the remaining d bytes of the business data are read from the $0^{th}$, $g^{th}$, $(2×g)^{th}$, . . . , $((d−1)×g)^{th}$ row of the column from top to bottom in turn;
   if the $(kc)^{th}$ column includes business data of d bytes, and d>M/2, then the remaining d bytes of the business data are read from rows except the $0^{th}$, $h^{th}$, $(2×h)^{th}$, . . . , $((M−d−1)×h)^{th}$ row of the column from top to bottom in turn;
   wherein, the byte number of valid data is F, and the row number of the byte interleaver is M, kc=floor(F/M), d=FmodM, g=floor(M/d), h=floor(M/(M−d)).

4. The method according to claim 2, wherein in step B, for the data in the check region of the byte interleaver, the cyclic shift is performed from bottom to top.

5. A decoding method for decoding Reed-Solomon (RS) codes, including:

a: filling data in a byte interleaver by column in turn;
b: performing RS decoding by row method, and writing information data of each row obtained after decoding into the corresponding row in an information region of the byte interleaver in turn;
c: reading business data from the $0^{th}$ to $(kc-1)^{th}$ column in the information region of the byte interleaver in turn;
d: if the $(kc)^{th}$ column includes business data of d bytes, and 0<d≦M/2, then the remaining d bytes of the business data being read from the $0^{th}$, $g^{th}$, $(2×g)^{th}$, . . . , $((d−1)×g)^{th}$ row of the column from top to bottom in turn;
if the $(kc)^{th}$ column includes business data of d bytes, and d>M/2, then the remaining d bytes of the business data being read from rows except the $0^{th}$, $h^{th}$, $(2×h)^{th}$, . . . , $((M−d−1)×h)^{th}$ row of the column from top to bottom in turn;
wherein the byte number of valid data is F, and the row number of the byte interleaver is M, kc=floor(F/M), d=FmodM, g=floor(M/d), h=floor(M/(M−d)).

6. A decoding device for decoding Reed-Solomon (RS) codes, including:
   a data filling unit for filling the byte interleaver with data by column in turn;
   a cyclic shift unit for sending cyclic shift control signals to the byte interleaver, and performing cyclic shift to data in a check region of the byte interleaver by row and/or by column, so as to make the data of each row in the check region become check data in sequence of data of corresponding row in an information region of the byte interleaver;
   a decoding unit for performing RS decoding to data in the byte interleaver by row method, and writing information data of each row obtained after decoding into the corresponding row in the information region of the byte interleaver in turn; and
   a data extraction unit for reading business data of the decoded information data from the information region of the byte interleaver by column.

7. The device according to claim 6, wherein the cyclic shift is performed to the data in the check region of the byte interleaver by column by the cyclic shift unit, a bit number of shifting all rows in the $i^{th}$ column in the check region is: floor(i×M/S); wherein, M is a row number of the byte interleaver, and S is a column number of the check region, i is 0, 1, . . . , S−1.

8. The device according to claim 6, wherein,
   the data extraction unit is used for reading the business data from the $0^{th}$ to $(kc-1)^{th}$ column in the information region of the byte interleaver in turn; and
   if the $(kc)^{th}$ column includes business data of d bytes, and 0<d≦M/2, then the data extraction unit reads the remaining d bytes of the business data from the $0^{th}$, $g^{th}$, $(2×g)^{th}$, . . . , $((d−1)×g)^{th}$ row of the column from top to bottom in turn;
   if the $(kc)^{th}$ column includes business data of d bytes, and d>M/2, then the data extraction unit reads the remaining d bytes of the business data from rows except the $0^{th}$, $h^{th}$, $(2×h)^{th}$, . . . , $((M−d−1)×h)^{th}$ row of the column from top to bottom in turn;
   wherein the byte number of valid data is F, and the row number of the byte interleaver is M, kc=floor(F/M), d=FmodM, g=floor(M/d), h=floor(M/(M−d)).

9. The device according to claim 7, wherein for the data in the check region of the byte interleaver, the cyclic shift is performed from bottom to top by the cyclic shift unit.

10. A decoding device for decoding Reed-Solomon (RS) codes, including:
- a data filling unit for filling the byte interleaver with data by column in turn;
- a decoding unit for performing RS decoding to data in the byte interleaver by row method, and writing information data of each row obtained after decoding into the corresponding row in an information region of the byte interleaver in turn;
- a data extraction unit for reading business data from the $0^{th}$ to $(kc-1)^{th}$ column in the information region of the byte interleaver in turn; and
- if the $(kc)^{th}$ column includes business data of d bytes, and $0 < d \leq M/2$, then the data extraction unit reads the remaining d bytes of the business data from the $0^{th}$, $g^{th}$, $(2 \times g)^{th}$, ..., $((d-1) \times g)^{th}$ row of the column from top to bottom in turn;
- if the $(kc)^{th}$ column includes business data of d bytes, and $d > M/2$, then the data extraction unit reads the remaining d bytes of the business data from rows except the $0^{th}$, $h^{th}$, $(2 \times h)^{th}$, ..., $((M-d-1) \times h)^{th}$ row of the column from top to bottom in turn;
- wherein the byte number of valid data is F, and the row number of the byte interleaver is M, $kc = \text{floor}(F/M)$, $d = F \bmod M$, $g = \text{floor}(M/d)$, $h = \text{floor}(M/(M-d))$.

* * * * *